(12) United States Patent
Giazzon

(10) Patent No.: US 11,487,320 B1
(45) Date of Patent: Nov. 1, 2022

(54) PROTECTIVE COVER FOR A LAPTOP COMPUTER

(71) Applicant: MAX Interactive, Inc., Costa Mesa, CA (US)

(72) Inventor: Albert George Giazzon, San Clemente, CA (US)

(73) Assignee: Max Interactive, Inc., Costa Mesa, CA (US)

( * ) Notice: Subject to any disclaimer, the term of this patent is extended or adjusted under 35 U.S.C. 154(b) by 680 days.

(21) Appl. No.: 16/527,889

(22) Filed: Jul. 31, 2019

Related U.S. Application Data

(63) Continuation-in-part of application No. 16/523,289, filed on Jul. 26, 2019, now Pat. No. 11,402,874.

(60) Provisional application No. 62/850,272, filed on May 20, 2019.

(51) Int. Cl.
*G06F 1/16* (2006.01)
*H05K 5/03* (2006.01)

(52) U.S. Cl.
CPC .............. *G06F 1/1613* (2013.01); *H05K 5/03* (2013.01); *G06F 2200/1633* (2013.01)

(58) Field of Classification Search
CPC ........ G06F 1/16; G06F 1/1613; G06F 1/1656; G06F 2200/1633; H05K 5/03
USPC .............................. 206/320, 586; 361/679.55
See application file for complete search history.

(56) References Cited

U.S. PATENT DOCUMENTS

| | | | |
|---|---|---|---|
| 5,682,993 A * | 11/1997 | Song | G06F 1/1628 361/679.55 |
| 6,109,434 A | 8/2000 | Howard, Jr. | |
| 7,643,274 B2 * | 1/2010 | Bekele | G06F 1/16 361/679.55 |
| 7,672,117 B1 | 3/2010 | Gary et al. | |
| 8,613,992 B2 | 12/2013 | Hsu | |
| 9,380,854 B2 | 7/2016 | Hamra | |
| 9,778,702 B2 | 10/2017 | Song et al. | |
| 10,216,222 B2 | 2/2019 | Fenton et al. | |
| 10,234,898 B2 | 3/2019 | Bekele | |
| 10,990,134 B2 * | 4/2021 | Ho | G06F 1/1656 |
| 2005/0187784 A1 | 8/2005 | Bander et al. | |
| 2006/0042996 A1 | 3/2006 | Picot et al. | |
| 2006/0226040 A1 | 10/2006 | Medina | |
| 2008/0308437 A1 | 12/2008 | Lin | |
| 2010/0110629 A1 | 5/2010 | Dietz et al. | |
| 2014/0063784 A1 | 3/2014 | Muiter | |

(Continued)

FOREIGN PATENT DOCUMENTS

WO  WO2013069005  5/2013

*Primary Examiner* — Bryon P Gehman
(74) *Attorney, Agent, or Firm* — Eric Karich; Karich & Associates

(57) ABSTRACT

A protective cover for a laptop computer having a screen portion has a main body that extends to an outer perimeter, the outer perimeter including a downwardly extending wall which extends downwardly from the outer perimeter. The cover further has a plurality of tabs extending inwardly from the downwardly extending wall of the top cover, adjacent the outer perimeter, adapted for attaching the top cover to the screen portion of the laptop computer. The main body, the plurality of tabs, and the downwardly extending wall are all of integral construction, and further have a perimeter covering that covers at least a portion of the main body and the downwardly extending wall, the perimeter covering being formed of a resilient material.

4 Claims, 4 Drawing Sheets

(56) References Cited

U.S. PATENT DOCUMENTS

2017/0112249 A1 4/2017 Peterson
2019/0086953 A1 3/2019 Chavennes

* cited by examiner

PROTECTIVE COVER FOR A LAPTOP COMPUTER

CROSS-REFERENCE TO RELATED APPLICATIONS

This application for utility patent is a continuation-in-part of a previously filed utility patent, having the application Ser. No. 16/523,289, filed Jul. 26, 2019. This application also claims the benefit of U.S. Provisional Application No. 62/850,272, filed May 20, 2019.

BACKGROUND OF THE INVENTION

Field of the Invention

This invention relates generally to protective covers, and more particularly to a protective cover for use with a laptop computer.

Description of Related Art

The prior art teaches many forms of covers for computers and computer components.

Chavannes, U.S. 2019/0086953, for example, teaches a single protective cover for protecting the screen of a portable computer, the cover having a plastic central core and an aluminum outer shell. Four adhesive strips are applied to the outer shell so that its width is parallel to the pair of opposed major edges. The adhesive strip is spaced from one of the opposed major edges by approximately one-half the adhesive strip's height and is spaced from one of the opposed minor edges by a distance of approximately the adhesive strip's height.

Picot, U.S. 2006/0042996, teaches a protective cover for a laptop intended to be directly or indirectly separately mounted on the upper surface or screen and lower surface or base of the latter, respectively. The covers are attached via an adhesive or Velcro, in a manner that allows relative movement.

Hsu, U.S. Pat. No. 8,613,992, teaches a protective cover of an electronic device that includes a leather protective cover, which includes an outside surface and a bottom surface. An adhesive construction is attached to the bottom surface of the leather layer. The adhesive construction includes a lower adhesive layer (acrylic, rubber, or silicone based adhesive) for strongly bonding a middle substrate (non-woven fabric, PET, about 0.05-0.1 mm thick) to the leather layer. A weaker upper adhesive layer is provided for bonding the cover to the electronic device, bonding between 0.5-1.0 Kg/square inch, so that the protective cover may be readily attached and detached from the electronic device.

The present invention better fulfills the needs of the marketplace and provides further advantages as described in the following summary.

SUMMARY OF THE INVENTION

The present invention teaches certain benefits in construction and use which give rise to the objectives described below.

The present invention provides a protective cover for a laptop computer having a screen portion. The protective cover comprises a main body that extends to an outer perimeter, the outer perimeter including a downwardly extending wall which extends downwardly from the outer perimeter. The cover further comprises a plurality of tabs extending inwardly from the downwardly extending wall of the top cover, adjacent the outer perimeter, adapted for attaching the top cover to the screen portion of the laptop computer. The main body, the plurality of tabs, and the downwardly extending wall are all of integral construction, and further comprise a perimeter covering that covers at least a portion of the main body and the downwardly extending wall, the perimeter covering being formed of a resilient material.

A primary objective of the present invention is to provide a protective cover for a laptop computer having advantages not taught by the prior art.

Another objective is to provide a protective cover which can be attached to a laptop computer via a plurality of tabs.

A further objective is to provide a protective cover having a perimeter covering that covers at least a portion of the main body and the downwardly extending wall, the perimeter covering being formed of a resilient material.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, a protective cover 10 for a laptop computer 12.

Figure 1:
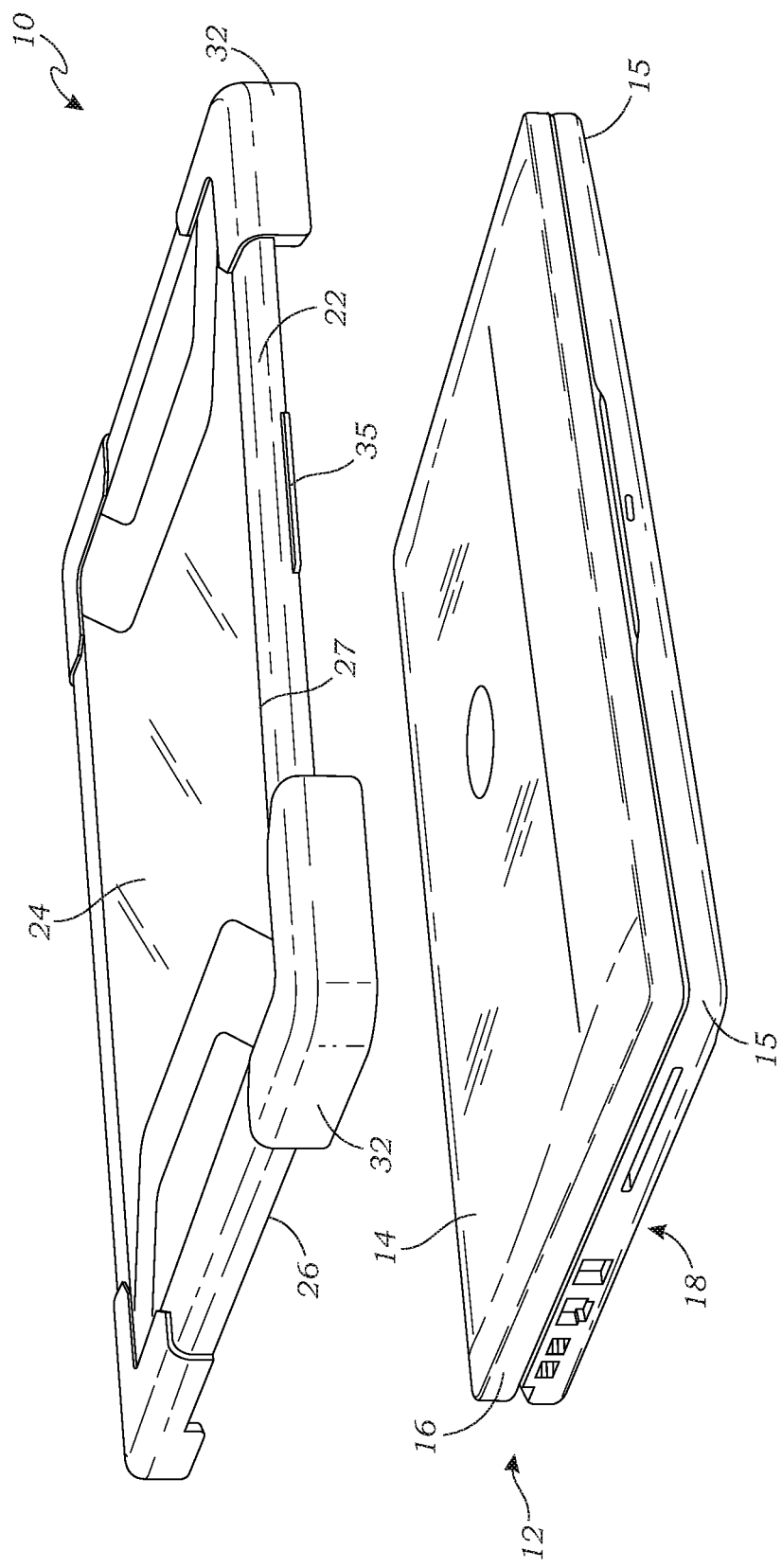
FIG. 1 is an exploded top perspective view of an external protective cover for a laptop computer according to one embodiment of the present invention.
Figure 2:
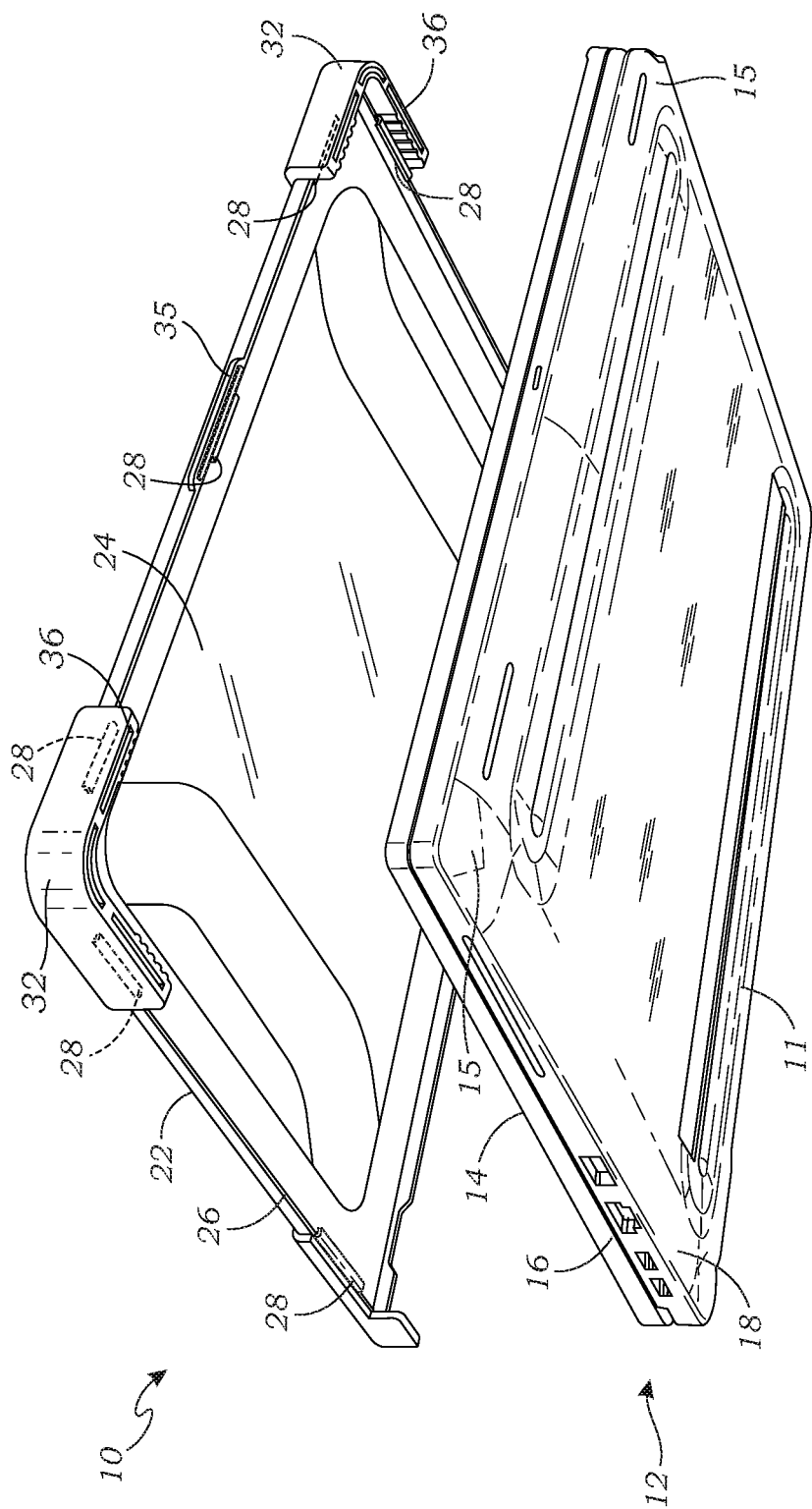
FIG. 2 is an exploded bottom perspective view thereof.

FIG. 1 is an exploded top perspective view of one embodiment of the protective cover 10, and FIG. 2 is an exploded bottom perspective view of the protective cover 10. As shown in FIGS. 1-2, the protective cover 10 is adapted to be mounted on a screen portion 14 of the laptop 12. As discussed in greater detail below, the cover 10 is mounted to an outer edge 16 of the screen portion 14 via the plurality of tabs 28, described in greater detail below.

Figure 3:
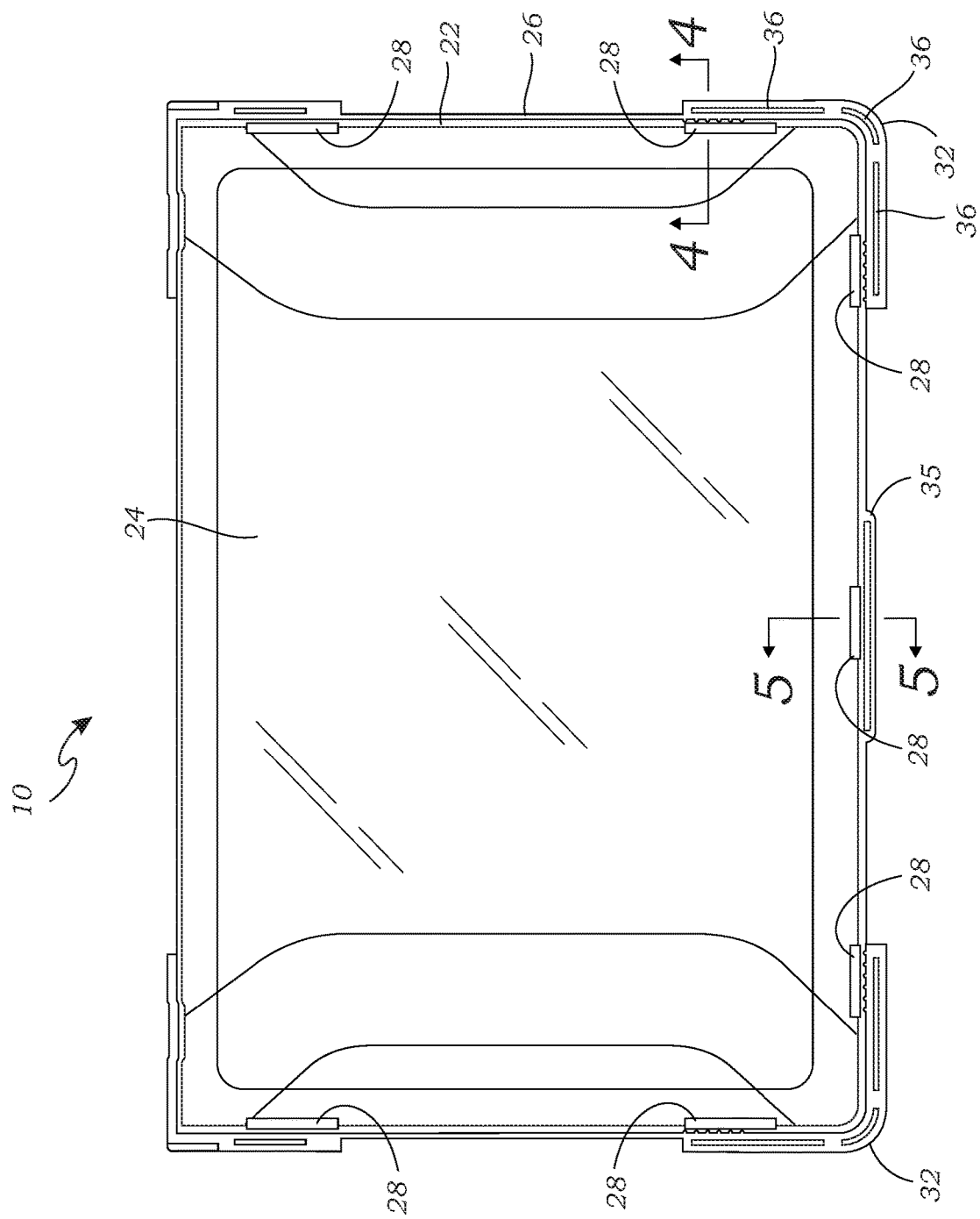
FIG. 3 is a bottom plan view of the protective cover, showing a plurality of tabs.

FIG. 3 is a bottom plan view of the protective cover 10. As shown in FIGS. 1-3, the protective cover 10 includes a main body 24 that extends to an outer perimeter 22. The outer perimeter 22 includes a downwardly extending wall 26 which extends downwardly from the outer perimeter 22. In this embodiment, the outer perimeter 22 has a perimeter covering 27 that covers at least a portion of the main body 24 and the downwardly extending wall 26. The perimeter covering 27 may be formed of a resilient material such as thermoplastic polyurethane (TPU), thermoplastic elastomer, or other suitable resilient material (e.g., silicone, soft plastic, rubber, etc.), while the main body 24 is constructed of a rigid material such as polycarbonate. The main body 24 may be integrally formed with the tabs 28, such that the tabs 28 are of the same rigid material. In this embodiment, the outer perimeter 22 is co-molded with the main body 24. In one embodiment, the main body 24, the downwardly extending wall 26, and the tabs 28 are constructed of acrylic.

As shown in the figures, the protective cover 10 may further include resilient corners 32, to further protect the laptop 12 in case of a fall. In this embodiment, the corners 32 project outwardly and downwardly far enough to provide protection to the laptop computer 12 without the use of a bottom cover. For example, many new laptops are designed to survive a drop from roughly the height of a desk, and have further added features such as rubber bumpers, reinforced ports and hinges, and mechanically anchored keys. The cover 10 complements this modern laptop design, by providing the front corners 32 which are thicker than the rest of the outer perimeter 22 and have a set of clefts 36 on the inner edge of the corners 32, thereby providing further protection to corners 15 of the laptop 12. The front corners 32 may be constructed of a similar material to the perimeter covering 27, as described above.

The downwardly extending wall 26 is shaped and adapted to correspond with the outer edges 16 of the laptop 12, and may include portions which are lower, so that a user may access portions of the laptop 12 such as a power connection, media drive, etc., while the protective cover 10 is installed.

As shown in FIGS. 2-3, the main body 24 includes the plurality of tabs 28 which extend inwardly from the downwardly extending wall 26, adjacent the outer perimeter 22. The tabs 28 are spaced a distance apart, such that any supported weight is distributed across the tabs 28. In this embodiment, there are six tabs 28 extending from the wall 26, but in other embodiments, there may be a greater or fewer number of tabs spaced in any desired combination, as deemed suitable by those skilled in the art. While this configuration has provided excellent results, alternative configurations may also be used by one skilled in the art, and such alternative configurations should be considered within the scope of the present invention.

Figure 4:
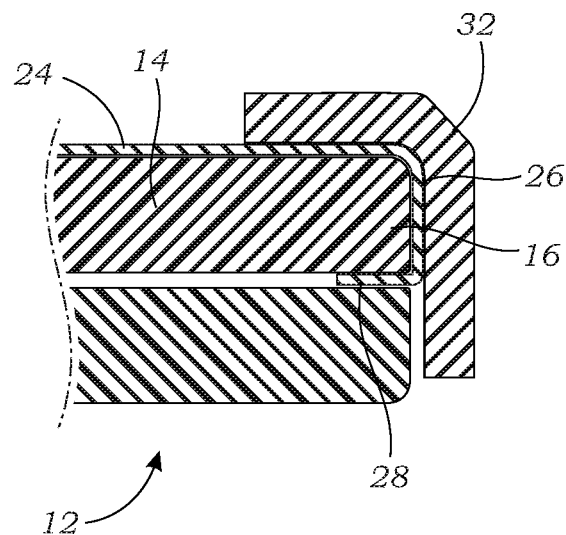
FIG. 4 is a sectional view of a front corner of the cover, taken along line 4-4 in FIG. 3, illustrating the cover mounted on the laptop.

FIG. 4 is a sectional view of the front corner 32 of the cover 10 fitted onto the laptop 12. As shown in FIG. 4, the main body 24 of the protective cover 10 is adapted to fit over the screen portion 14 of the of the laptop 12, the downwardly extending wall 26 is adapted to fit over the side edge 16 of the screen portion 14, and the tabs 28 are adapted to fit beneath the screen portion 14 of the laptop 12, thereby frictionally engaging the cover 10 with the laptop 12.

Figure 5:
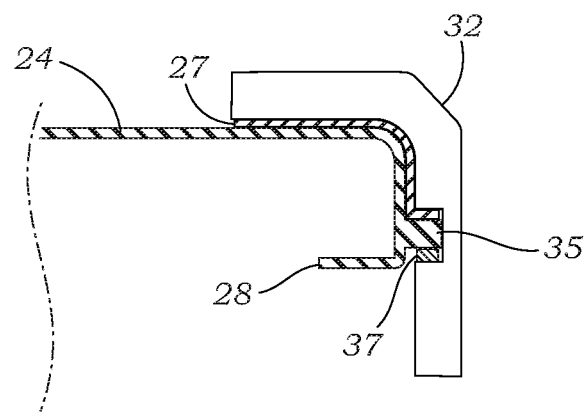
FIG. 5 is a sectional view of an outer perimeter of the cover, taken along line 5-5 in FIG. 3.

FIG. 5 is a sectional view of the outer perimeter 22 of the cover 10, taken along line 5-5 in FIG. 3. In this embodiment, a projection in the material of the downwardly extending wall 26 may form a ledge 35. The ledge 35 may include a rubber pad 37, and the perimeter covering 27 may extend outwardly onto the ledge 35. When the protective cover 10 is securely attached to the laptop 12, a user may lift the ledge 35 to assist in opening the laptop 12. As shown in FIG. 5, the main body 24 is integrally formed with the downwardly extending wall 26, the ledge 35, and the tab, all being of a rigid material (as described above).

The tabs 28 of the protective cover 10 provides a durable attachment of the cover 10 to the laptop 12, capable of passing drop tests of a minimum of four feet, particularly on hard surfaces, and durable enough to withstand hitting the corner of the laptop 12, without detachment of the protective cover 10 from the laptop 12.

As used in this application, the words "a," "an," and "one" are defined to include one or more of the referenced item unless specifically stated otherwise. The terms "approximately" and "about" are defined to mean+/−10%, unless otherwise stated. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application. While the invention has been described with reference to at least one particular embodiment, it is to be clearly understood that the invention is not limited to these embodiments, but rather the scope of the invention is defined by claims made to the invention.

What is claimed is:

1. A protective cover for a laptop computer having a screen portion and a bottom portion, the protective cover comprising:
    a main body that extends to an outer perimeter, the outer perimeter including a downwardly extending wall which extends downwardly from the outer perimeter;
    a plurality of tabs extending inwardly from the downwardly extending wall of the top cover adjacent the outer perimeter adapted for attaching the top cover to the screen portion of the laptop computer;
    wherein the main body, the plurality of tabs, and the downwardly extending wall are all formed of acrylic;
    shock absorbing front corners that project outwardly and downwardly far enough to protect and at least partially cover the bottom cover, the front corners being thicker than the outer perimeter, the front corners being formed of thermoplastic elastomer, and connected with the acrylic of the outer perimeter and the downwardly extending wall via a co-molding process; and
    a perimeter covering that covers at least a portion of the main body and all of the downwardly extending wall between the front corners, the perimeter covering being formed of a thermoplastic elastomer and formed via a co-molding process with the acrylic of the main body.

2. The protective cover of claim 1, wherein each of the shock absorbing front corners include a set of clefts on an inner edge of each of the shock absorbing front corners.

3. The protective cover of claim 1, further comprising a ledge that extends outwardly from the downwardly extending wall between the shock absorbing front corners, wherein the perimeter covering extends outwardly onto the ledge, and a rubber pad is positioned on the ledge opposite the perimeter covering.

4. A protective cover for a laptop computer having a screen portion and a bottom portion, the protective cover comprising:
    a main body that extends to an outer perimeter, the outer perimeter including a downwardly extending wall which extends downwardly from the outer perimeter;
    a plurality of tabs extending inwardly from the downwardly extending wall of the top cover adjacent the outer perimeter adapted for attaching the top cover to the screen portion of the laptop computer;
    wherein the main body, the plurality of tabs, and the downwardly extending wall are all formed of acrylic;
    shock absorbing front corners that project outwardly and downwardly far enough to protect and at least partially cover the bottom cover, the front corners being thicker than the outer perimeter, the front corners being formed of thermoplastic elastomer, and connected with the acrylic of the outer perimeter and the downwardly extending wall via a co-molding process;
    a perimeter covering that covers at least a portion of the main body and all of the downwardly extending wall between the front corners, the perimeter covering being formed of a thermoplastic elastomer and formed via a co-molding process with the acrylic of the main body;

wherein each of the shock absorbing front corners include a set of clefts on an inner edge of each of the shock absorbing front corners; and further comprising a ledge that extends outwardly from the downwardly extending wall between the shock absorbing front corners, wherein the perimeter covering extends outwardly onto the ledge, and a rubber pad is positioned on the ledge opposite the perimeter covering.

\* \* \* \* \*